United States Patent [19]

Gikow, deceased et al.

[11] 3,989,964

[45] Nov. 2, 1976

[54] PIEZOELECTRIC SWITCH ACTIVATING MEANS

[75] Inventors: Emanuel Gikow, deceased, late of West Long Branch, N.J., by Ida M. Gikow, executrix; John R. Vig, Colts Neck, N.J.

[73] Assignee: The United States of America as represented by the Secretary of the Army, Washington, D.C.

[22] Filed: Aug. 5, 1976

[21] Appl. No.: 602,176

[52] U.S. Cl. .................................. 310/8.1; 310/8.3; 310/9.5; 310/9.6; 310/9.8; 200/181; 317/144
[51] Int. Cl.² ........................................ H01L 41/04
[58] Field of Search ..................... 200/181; 317/144; 310/8.5, 8.6, 9.5, 9.6, 9.8

[56] References Cited
UNITED STATES PATENTS

| | | | |
|---|---|---|---|
| 2,497,108 | 2/1950 | Williams | 310/9.6 X |
| 3,168,623 | 2/1965 | Petermann | 310/8.5 X |
| 3,271,622 | 9/1966 | Malagodi et al. | 310/8.1 X |
| 3,325,780 | 6/1967 | Horan | 310/8.5 X |
| 3,355,603 | 11/1967 | Hesse et al. | 310/9.6 X |
| 3,405,289 | 10/1968 | Gikow | 310/8.5 |

*Primary Examiner*—Mark O. Budd
*Attorney, Agent, or Firm*—Nathan Edelberg; Sheldon Kanars; Daniel Sharp

[57] ABSTRACT

At least three pairs of opposing electrodes on the two major faces of a piezoelectric or electrostrictive transducer element having a gap which is adapted to change in response to selected control voltages applied across the three pairs of electrodes. The pairs of electrodes are electrically insulated from one another and one pair of electrodes covers substantially one half of the major faces across from the gap, while the other two pairs of electrodes are disposed on the major faces of the transducer adjacent the gap and respectively covering substantially quarter sector portions of the transducer surface. By the mechanical bonding of electrical switch contacts for example to the opposing end faces at the gap, switch actuation is provided by the application of control voltages across all three pairs of electrodes, causing the gap to diminish and thereafter shorting the pairs of electrodes or applying a reverse control voltage to widen the gap.

14 Claims, 8 Drawing Figures

PIEZOELECTRI SWITCH ACTIVATING MEANS

The invention described herein may be manufactured and used by or for the Government for governmental purposes without the payment of any royalties thereon or therefor.

BACKGROUND OF THE INVENTION

1. Field of the Invention

This invention relates to electrical switch devices and more particularly to a switch activating element comprised of a transducer member of a piezoelectric or electrostrictive type occasioned by the application of an electric field to said member.

2. Description of the Prior Art

Switches of the electromagnetic type have been used for many years. Such devices, have a relatively large mass and occupy considerable space, owing in part to the need for a magnetic field producing means. Switches embodying bimorph or bender transducers have also been made wherein one contact is at the end of a cantilever type linear element. The obvious disadvantage of this type of switch is that in order to obtain sufficient sensitivity, stiffness of the element must be sacrificed. This is because the sensitivity of the bender element is inversely proportional to the thickness, i.e. the distance between electrodes, of the bender element, whereas the stiffness of said element is directly proportional to the thickness. Accordingly, the movement of such an element is directly proportional to the thickness. The movement of such an element is in the thickness direction and because the stiffness of such element is limited, there is a tendency for such elements to sag under their own weight. Although the rigidity of such bender elements can be improved by increasing the thickness of the element, this would decrease the sensitivity and require unduly high voltages for operation. The only alternative is to sandwich several thin layers; however, such multiple layering is expensive and the bending problem becomes comparatively difficult.

In U.S. Pat. No. 3,405,289, entitled "Switch", dated Oct. 8, 1968, by E. Gikow, which patent is assigned to the assignee of the present invention, there is disclosed a switch wherein the transducer member is in the form of a split ring of piezoelectric material provided with a single pair of electrodes on opposite faces of the ring to which a unidirectional control voltage is applied. The fluctual movement of the split ring in response to the application of the control voltage causes the ends of the ring to move relative to one another, which by the connection of electrical switch contacts thereto in various configurations are actuated by the relative movement of the end faces of the ring which exist at the gap in the transducer ring.

SUMMARY

Briefly, the present invention is directed to a switch activating element comprising a transducer member of a material which deforms when subjected to an applied electrical potential and being in the form of a split ring or equivalent structure having a pair of opposed major faces and a pair of end faces at the end thereof forming a gap therebetween, a first pair of opposed electrodes formed on substantially one half of the major faces across from the gap and a second and third pair of opposed electrodes insulated from said first pair of electrodes and formed on respective substantially one quarter portions of the major faces adjacent the gap. The polarization of the transducer material between the three pairs of electrodes is selectively chosen and control voltages respectively applied thereto in a predetermined sequence for causing the gap to decrease and increase whereupon electrical switch contacts can be actuated in response to the relative movement of the end faces.

DESCRIPTION OF THE PREFERRED EMBODIMENTS

Figure 1:
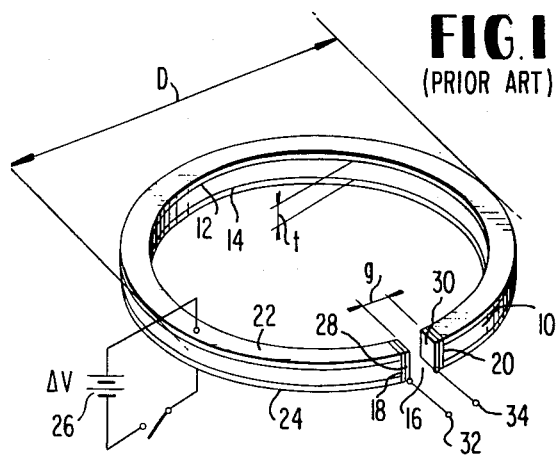
FIG. 1 is a perspective view typically illustrative of a prior art device of the type to which the present invention is directed.

While U.S. Pat. No. 3,405,289 referred to above may be resorted to for teachings of various types of switch arrangements actuated by an arcuate piezoelectric or electrostrictive transducer member in response to the application of an electric field, the simplest configuration of this type of device is shown in FIG. 1 wherein reference numeral 10 denotes a transducer element in the form of a flat circular ring having a thickness ($t$) and an outer diameter D comprising material which deforms when subjected to an electric field. The material consists of piezoelectric material such as a ferroelectric ceramic having a polarization in a direction parallel to the thickness of the ring, i.e. normal to the opposed major faces 12 and 14. The ring 10 includes a gap 16 having a width ($g$) bounded by the end faces 18 and 20. A pair of electrodes 22 and 24 are applied respectively to the major faces 12 and 14 and substantially cover the entire surface. When a unidirectional (DC) electrical potential $\Delta V$ supplied from a source such as a battery 26 or other suitable means is applied to the electrodes 22 and 24, a change in the width of the gap 16 is effected, causing the end faces 18 and 20 to either come together or spread further apart. The direction of movement is dependent upon the direction of polarization of the ring material and the polarity of the applied voltage. The change $\Delta g$ in the gap dimensions can be shown to be governed by the following expression:

$$\Delta g = g d_{31} \Delta V/t \qquad (1)$$

Where $t$ = the thickness of the ring 10 between the electrodes 22 and 24, $\Delta V$ is the applied voltage from the source 26, and $d_{31}$ is the piezoelectric constant of the material.

The structure shown in FIG. 1 thus comprises an electrical transducer which when a pair of electrical switch contacts 28 and 30 are bonded or affixed in some suitable manner to the end faces 18 and 20, respectively, combine to form an electrical switch which is adapted to make or break an electrical circuit connection between a pair of electrical terminals 32 and 34 in response to the change in the gap as a result of the applied voltage to the electrodes 22 and 24.

Figure 2:
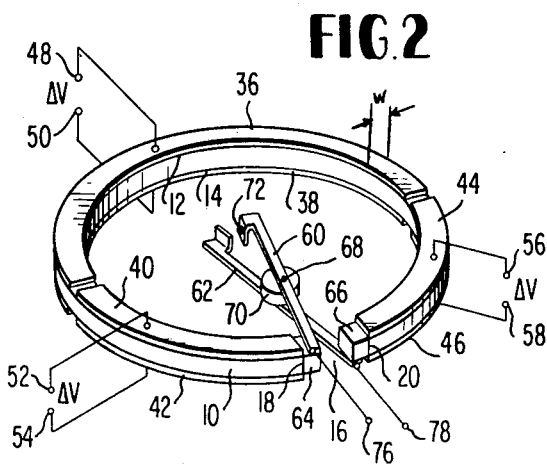
FIG. 2 is a perspective view of a first embodiment of a switch including the teachings of the present invention.

An improvement in the switch activating means for piezoelectric switches of the type described is contemplated by the subject invention whereby change of the gap dimension is greatly enhanced by resorting to a configuration such as shown in FIG. 2 wherein three sets of electrodes are formed on the major faces 12 and 14 of the body of piezoelectric material in the form of a ring 10. More particularly, a first pair of electrodes 36 and 38 cover substantially one half of the surface of the major faces 12 and 14 and being oriented relative to the gap 16 so as to be on the opposite portion of the ring, i.e. across from the gap. As shown, the second and third pairs of electrodes 40 and 42, and 44 and 46 cover substantially respective one quarter sectors on the surface of the major faces 12 and 14, terminating substantially at one end at the end faces 18 and 20. The second pair of contacts 40 and 42 and the third pair of contacts 44 and 46 are electrically insulated from the first pair of contacts 36 and 38 by either a physical separation (as shown) or by intermediate regions of insulating material (not shown). Additionally, electrical terminals 48 and 50 are connected to electrodes 36 and 38, respectively. In a like manner, terminals 52 and 54 are connected to electrodes 40 and 42, respectively, and terminals 56 and 58 are connected to electrodes 44 and 46. DC control voltages $\Delta V$ are supplied to the terminals in a manner to be described hereinafter.

The transducer element consisting of the split ring 10 of piezoelectric material and the three sets of electrodes referred to above comprise an activating member for an electrical switch assembly which additionally includes a pair of switch arms 60 and 62 bonded to insulator pads 64 and 66 secured to the end faces 18 and 20. The switch arms 60 and 62 are pivotally mounted together in the manner of scissor blades by a pin 68 passing through the insulator 70 between the two switch arms. The free ends of the switch arms 60 and 62 carry respective switch contacts 72 and 74 (not shown). The fixed ends of the switch arms 60 and 62 are connected to a pair of electrical terminals 76 and 78.

Figure 3:
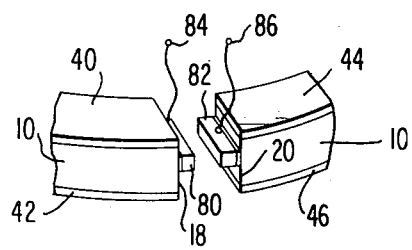
FIG. 3 is a fragmentary perspective view illustrative of a modification of the embodiment shown in FIG. 2 wherein switch contacts are shown affixed directly to the end faces of the split transducer member.

The embodiment of the switch shown in FIG. 2 can, when desirable, be simplified in the manner shown in FIG. 3 by simply insulatingly bonding a pair of switch contacts 80 and 82 to the end faces 18 and 20 intermediate so as not to be in contact with the pairs of electrodes 40 and 42, and 44 and 46 formed on the major faces 12 and 14 as shown in FIG. 3. Electrical terminals 84 and 86, respectively, connected to the switch contacts 80 and 82 provide a relatively simple yet effective switch arrangement.

Figure 4:
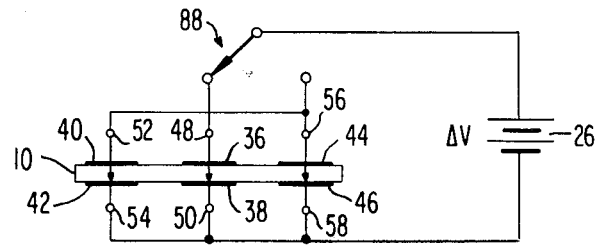
FIG. 4 is an electrical circuit diagram illustrative of one embodiment of electrode control voltage application and direction of polarization of the transducer element between electrode pairs.

As noted above, the inventive concept of the subject invention is directed to the improved switch activating means which is accomplished by three pairs of electrodes instead of a single pair, as taught in the above-referenced prior art U.S. Pat. No. 3,405,289. Referring now to FIG. 4, there is disclosed a schematic representation of the switch activating means shown in FIG. 3 and the manner by which the pairs of electrodes are energized for operation. To obtain a change in the gap width ($g$), it is first necessary to apply a control voltage $\Delta V$ simultaneously across both quarter sector electrode pairs 40 and 42, and 44 and 46. For a given relative polarity of the applied voltage and direction of polarization, the gap 16 (FIG. 2) will close to $\Delta g_1$ according to the expression:

$$\Delta g_1 = -(D-g)d_{31}(\Delta V/t) \qquad (2)$$

where $t$ is the thickness of the piezoelectric split ring element between the electrodes, $\Delta V$ is the applied voltage, $d_{31}$ is the piezoelectric constant for the material comprising the split ring, and D is the diameter of the split ring.

To open the gap to $\Delta g_2$, the two sets of electrodes previously energized by voltage $\Delta V$ are shorted out and the voltage $\Delta V$ is next applied across the opposing semicircular electrode pair 36 and 38, whereupon the gap will increase according to the following expression:

$$\Delta g_2 = D d_{31}(\Delta V/t) \qquad (3)$$

Where $g \ll D$ the net change $\Delta g$ can be expressed as:

$$\Delta g = \Delta g_2 - \Delta g_1 = 2D d_{31}(\Delta V/t) \qquad (4)$$

This set of operating conditions is easily achieved by utilizing a single pole two position switch 88 as shown in FIG. 4 wherein the armature contact portion is connected to one side of the supply source 26, while one of the fixed switch contacts is connected to one electrode for example electrode 36 through electrical terminal 48 while the other fixed switch contact is commonly connected to electrodes 40 and 44 by means of electrical terminals 52 and 56. The opposite or "ground" side of the supply source 26 is commonly connected to the other electrode 38, 42 and 46 of all three pairs of electrodes by means of the respective electrical terminals 50, 54 and 58.

Figure 5:
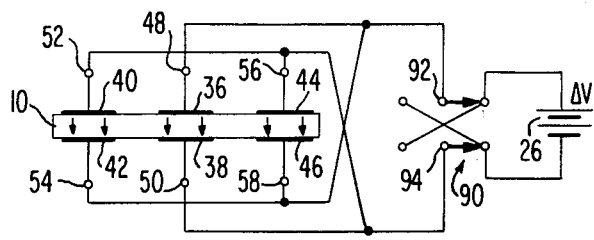
FIG. 5 is an electrical circuit diagram of another embodiment for applying control voltages to pairs of electrodes.

By simultaneoulsy applying the control voltage $\Delta V$ in one polarity to the semicircular electrodes 36 and 38 and of opposite polarity $-\Delta V$ to the other two pairs of electrodes 40 and 42 and 44 and 46 adjacent the gap 16, the total net change in the gap can be doubled by reversing each potential $\Delta V$ with a double pole double throw switch arrangement such as shown in FIG. 5 providing:

$$\Delta g' = 4D d_{31}(\Delta V/t) \qquad (5)$$

In the configuration shown in FIG. 5, a double pole, double throw switch 90 has both pairs of fixed switch contacts coupled to the DC source 26 in a criss-cross arrangement for reversing polarity of the voltage $\Delta V$ for the two positions. One of the armature contacts 92 is connected to electrode 36 via terminal 48 and electrodes 42 and 46 on the other side of the piezoelectric material via terminals 54 and 58. In a like manner, armature contact 94 of the switch 90 is connected to the electrode 38 via terminal 50 and the other two electrodes 40 and 44 via terminals 52 and 56.

Figure 6:
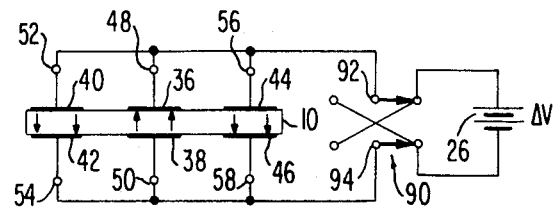
FIG. 6 is still yet another electrical circuit diagram illustrative of means for applying control voltages wherein the polarization of the transducer material between one pair of electrodes is opposite from that of the transducer material between the other two pairs of electrodes.

The same resultant effect achieved by the configuration shown in FIG. 5 can be achieved by fabricating the switch with the polarity of the piezoelectric material in the region between the semi-circular electrodes 36 and 38 reversed relative to the polarity of the piezoelectric material between the other two pairs of electrodes 40 and 42, and 44 and 46 such as shown in FIG. 6. In such a configuration, it is merely necessary to commonly couple all of the electrodes on the same major face of the piezoelectric element 10 together, such as by connecting terminals 48, 52 and 56 to the armature contact 92 of the two-pole, two-position switch 90 and the terminals 50, 54 and 58 for the electrodes on the opposite side of the element 10 to the other armature contact 94. The net result for changing the gap width for the configuration shown in FIG. 6 is substantially the same as that shown with respect to the configuration shown in FIG. 5.

Figure 7:
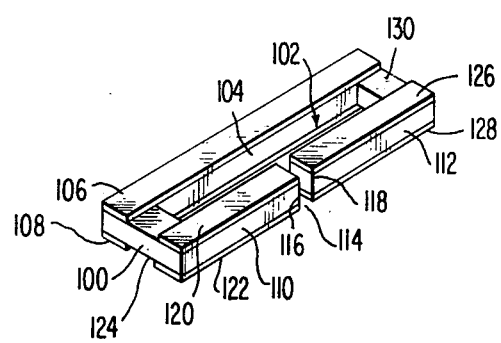
FIG. 7 is a view illustrative of a non-circular configuration for the transducer element.

Another modified form of the subject invention is shown in FIG. 7 disclosing that, when desirable, any number of alternate shapes for the piezoelectric element can be utilized other than a split ring as shown in the previous embodiments. FIG. 7, for example, depicts a generally rectangular shaped piezoelectric element 100 having a slot 102 separating a relatively long linear segment 104 on which a pair of electrodes 106 and 108 are applied and two opposed relatively shorter linear segments 110 and 112 running substantially parallel to the segment 104 and having a gap 114 defining a pair of end faces 116 and 118. As in the case of the other embodiments, a second pair of electrodes 120 and 122 are applied on the major faces of the segment 110 and being separated from the electrodes 106 and 108 on the segment 104 by a suitable separation or insulating region on the side portion 124. In a like fashion, a pair of electrodes 126 and 128 are applied on the segment 112 and being separated from the first pair of electrodes 106 and 108 by a suitable separation or insulating region on the side portion 130.

Figure 8:
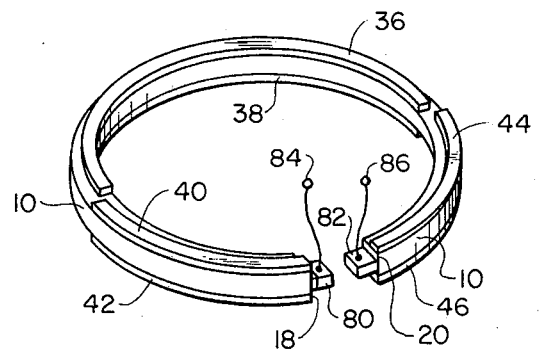
FIG. 8 is a view illustrating a modification of the transducer element of FIGS. 2 and 3.

When desirable, additional gap movement, due to a circular bimorph effect, can be obtained by applying the electrode pairs to less than the full width ($w$) of the major faces 12 and 14 of the circular ring 10. More particularly, as shown in FIG. 8, the electrode pairs 36 and 38 can be applied to the inner half of the width $a$ of the ring, i.e. from the inner diameter of the ring to one half of the width of the major faces 12 and 14 while applying the electrode pairs 40 and 42, and 44 and 46, to the outer half of $a$ the ring, i.e. from the middle of the major faces to the outer diameter of the ring. The gap closure due to the circular bimorph effect is then, $$\Delta g'' \approx 9\pi/2 \, d_{31} \, V(D/t)^2 \quad (6)$$

It should be pointed out that while the figures disclose what is at present considered to be the preferred embodiments of the subject invention, this disclosure is made by way of illustration only and is not meant to be interpreted in a limiting sense, since when desirable other modifications and alterations may be resorted to by those skilled in the art without departing from the spirit and scope of the invention as set forth in the following claims. Accordingly,

What is claimed is:

1. An electrical switch activating means comprising a transducer element which deforms when subject to an applied electrical potential, said element being in the form of a body member bounding an inner open space and having a gap therein at one point, having a pair of opposed major faces and a pair of end faces at the location of said gap and being adapted to operate switch contacts in response to gap spacing variation caused by the application of applied electrical potential to electrode pair means on said pair of opposed major faces,
said electrode pair means being at least three pairs of mutually electrically insulated electrodes, one pair of electrodes being located substantially directly across from said gap and the other two pairs being respectively located adjacently on either side of said gap;
first circuit means coupling said other two pairs of electrodes in parallel circuit relationship; and
second circuit means selectively applying respective electrical potentials across said one pair of electrodes and said other two pairs of electrodes in parallel for causing said gap to change spacing in first and second directions.

2. The switch activating means as defined by claim 1 wherein said body member comprises a unitary body of piezoelectric material arcuate in shape and having like polarization throughout.

3. The electrical switch activating means as defined by claim 1 wherein said body member comprises a unitary body and wherein one pair of electrodes covers a greater portion of said major faces than each of the other two pairs of electrodes.

4. The switch activating means as defined by claim 3 wherein said body member has like polarization throughout and wherein said second circuit means applies an electrical potential of first polarity to said one pair of electrodes and of opposite polarity to said other pairs of electrodes.

5. The switch activating means as defined by claim 3 wherein said second circuit means simultaneously applies opposite polarity potentials respectively to said one pair of electrodes and said other two pairs of electrodes to change spacing in said first direction and then reverses the respective polarities of the applied potentials to change the spacing in said second direction.

6. The switch activating means as defined by claim 3 wherein said transducer material is polarized in a first direction in the region of said first pair of electrodes and polarized in a second direction in the region of said other two pairs of electrodes.

7. The electrical switch activating means as defined by claim 6 wherein said at least three pairs of electrodes are connected in parallel and wherein said second circuit means applies an electrical potential to one polarity simultaneously, causing said gap to change spacing in said first direction and thereafter applies electrical potential of opposite polarity simultaneously to change said spacing in said second direction.

8. The switch activating means as defined by claim 1 wherein said one pair of electrodes covers substantially one half of the major faces and the other two pairs of electrodes cover substantially respective quarters of said major faces.

9. The switch activating means as defined by claim 8 and wherein said body member is comprised of a generally flat circular ring of selected polarization.

10. The switch activating means as defined by claim 1 wherein said body member is comprised of a non-circular piezoelectric element including a generally linear segment parallely separated from a pair of shorter linear segments joined to the first linear segment at one end with respective opposite ends defining said gap.

11. The switch activating means as defined by claim 10 wherein said first pair of electrodes is contained on the major faces of said first linear segment and said other two pairs of electrodes are contained on the major faces of the respective shorter linear segments.

12. The switch activating means as defined by claim 1 wherein said second circuit means comprises switch means coupled to a source of DC electrical potential.

13. The switch activating means as defined by claim 3 and wherein said one pair of electrodes is disposed on the inner portion of the width of said major faces while said other two pairs of electrodes are disposed on the outer portion of the width of said major faces.

14. The switch activating means as defined by claim 3 and wherein said one pair of electrodes is disposed on substantially the inner half portion of the width of said major faces while said other two pairs of electrodes are disposed on substantially the outer half portion of the width of said major faces.

* * * * *